US006991998B2

(12) United States Patent
Bedell et al.

(10) Patent No.: US 6,991,998 B2
(45) Date of Patent: Jan. 31, 2006

(54) ULTRA-THIN, HIGH QUALITY STRAINED SILICON-ON-INSULATOR FORMED BY ELASTIC STRAIN TRANSFER

(75) Inventors: Stephen W. Bedell, Wappingers Falls, NY (US); Anthony G. Domenicucci, New Paltz, NY (US); Keith E. Fogel, Mohegan Lake, NY (US); Effendi Leobandung, Wappingers Falls, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/883,883

(22) Filed: Jul. 2, 2004

(65) Prior Publication Data

US 2006/0001089 A1   Jan. 5, 2006

(51) Int. Cl.
*H01L 21/20* (2006.01)
(52) U.S. Cl. .................. 438/479; 438/164; 438/795
(58) Field of Classification Search ............. 438/478, 438/479, 480, 795, 164
See application file for complete search history.

(56) References Cited

U.S. PATENT DOCUMENTS

| 3,602,841 | A | 8/1971 | McGroddy |
|---|---|---|---|
| 4,665,415 | A | 5/1987 | Esaki et al. |
| 4,853,076 | A | 8/1989 | Tsaur et al. |
| 4,855,245 | A | 8/1989 | Neppl et al. |
| 4,952,524 | A | 8/1990 | Lee et al. |
| 4,958,213 | A | 9/1990 | Eklund et al. |
| 5,006,913 | A | 4/1991 | Sugahara et al. |
| 5,060,030 | A | 10/1991 | Hoke |
| 5,081,513 | A | 1/1992 | Jackson et al. |
| 5,108,843 | A | 4/1992 | Ohtaka et al. |
| 5,134,085 | A | 7/1992 | Gilgen et al. |
| 5,310,446 | A | 5/1994 | Konishi et al. |
| 5,354,695 | A | 10/1994 | Leedy |
| 5,371,399 | A | 12/1994 | Burroughes et al. |
| 5,391,510 | A | 2/1995 | Hsu et al. |

(Continued)

FOREIGN PATENT DOCUMENTS

EP   01/62362   6/1989

(Continued)

OTHER PUBLICATIONS

Rim, et al., "Transconductance Enhancement in Deep Submicron Strained-Si *n*-MOSFETs", International Electron Devices Meeting, 26, 8, 1, IEEE, Sep. 1998.

(Continued)

*Primary Examiner*—T. N. Quach
(74) *Attorney, Agent, or Firm*—Scully, Scott, Murphy & Presser; Robert M. Trepp

(57) ABSTRACT

A method of forming a semiconductor structure comprising a first strained semiconductor layer over an insulating layer is provided in which the first strained semiconductor layer is relatively thin (less than about 500 Å) and has a low defect density (stacking faults and threading defects). The method of the present invention begins with forming a stress-providing layer, such a SiGe alloy layer over a structure comprising a first semiconductor layer that is located atop an insulating layer. The stress-providing layer and the first semiconductor layer are then patterned into at least one island and thereafter the structure containing the at least one island is heated to a temperature that causes strain transfer from the stress-providing layer to the first semiconductor layer. After strain transfer, the stress-providing layer is removed from the structure to form a first strained semiconductor island layer directly atop said insulating layer.

18 Claims, 2 Drawing Sheets

U.S. PATENT DOCUMENTS

| | | | |
|---|---|---|---|
| 5,459,346 A | 10/1995 | Asakawa et al. | |
| 5,471,948 A | 12/1995 | Burroughes et al. | |
| 5,557,122 A | 9/1996 | Shrivastava et al. | |
| 5,561,302 A | 10/1996 | Candelaria | |
| 5,565,697 A | 10/1996 | Asakawa et al. | |
| 5,571,741 A | 11/1996 | Leedy et al. | |
| 5,592,007 A | 1/1997 | Leedy | |
| 5,592,018 A | 1/1997 | Leedy | |
| 5,670,798 A | 9/1997 | Schetzina | |
| 5,679,965 A | 10/1997 | Schetzina | |
| 5,683,934 A | 11/1997 | Candelaria | |
| 5,840,593 A | 11/1998 | Leedy | |
| 5,861,651 A | 1/1999 | Brasen et al. | |
| 5,880,040 A | 3/1999 | Sun et al. | |
| 5,940,736 A | 8/1999 | Brady et al. | |
| 5,946,559 A | 8/1999 | Leedy | |
| 5,960,297 A | 9/1999 | Saki | |
| 5,989,978 A | 11/1999 | Peidous | |
| 6,008,126 A | 12/1999 | Leedy | |
| 6,025,280 A | 2/2000 | Brady et al. | |
| 6,046,464 A | 4/2000 | Schetzina | |
| 6,066,545 A | 5/2000 | Doshi et al. | |
| 6,090,684 A | 7/2000 | Ishitsuka et al. | |
| 6,107,143 A | 8/2000 | Park et al. | |
| 6,117,722 A | 9/2000 | Wuu et al. | |
| 6,133,071 A | 10/2000 | Nagai | |
| 6,165,383 A | 12/2000 | Chou | |
| 6,221,735 B1 | 4/2001 | Manley et al. | |
| 6,228,694 B1 | 5/2001 | Doyle et al. | |
| 6,246,095 B1 | 6/2001 | Brady et al. | |
| 6,255,169 B1 | 7/2001 | Li et al. | |
| 6,261,964 B1 | 7/2001 | Wu et al. | |
| 6,265,317 B1 | 7/2001 | Chiu et al. | |
| 6,274,444 B1 | 8/2001 | Wang | |
| 6,281,532 B1 | 8/2001 | Doyle et al. | |
| 6,284,623 B1 | 9/2001 | Zhang et al. | |
| 6,284,626 B1 | 9/2001 | Kim | |
| 6,319,794 B1 | 11/2001 | Akatsu et al. | |
| 6,361,885 B1 | 3/2002 | Chou | |
| 6,362,082 B1 | 3/2002 | Doyle et al. | |
| 6,368,931 B1 | 4/2002 | Kuhn et al. | |
| 6,403,486 B1 | 6/2002 | Lou | |
| 6,403,975 B1 | 6/2002 | Brunner et al. | |
| 6,406,973 B1 | 6/2002 | Lee | |
| 6,461,936 B1 | 10/2002 | Von Ehrenwall | |
| 6,476,462 B2 | 11/2002 | Shimizu et al. | |
| 6,493,497 B1 | 12/2002 | Ramdani et al. | |
| 6,498,358 B1 | 12/2002 | Lach et al. | |
| 6,501,121 B1 | 12/2002 | Yu et al. | |
| 6,506,652 B2 | 1/2003 | Jan et al. | |
| 6,509,618 B2 | 1/2003 | Jan et al. | |
| 6,521,964 B1 | 2/2003 | Jan et al. | |
| 6,531,369 B1 | 3/2003 | Ozkan et al. | |
| 6,531,740 B2 | 3/2003 | Bosco et al. | |
| 6,699,764 B1 * | 3/2004 | Tweet et al. | 438/305 |
| 6,855,649 B2 * | 2/2005 | Christiansen et al. | 438/311 |
| 2001/0009784 A1 | 7/2001 | Ma et al. | |
| 2002/0074598 A1 | 6/2002 | Doyle et al. | |
| 2002/0086472 A1 | 7/2002 | Roberds et al. | |
| 2002/0086497 A1 | 7/2002 | Kwok | |
| 2002/0090791 A1 | 7/2002 | Doyle et al. | |
| 2003/0032261 A1 | 2/2003 | Yeh et al. | |
| 2003/0040158 A1 | 2/2003 | Saitoh | |
| 2003/0057184 A1 | 3/2003 | Yu et al. | |
| 2003/0067035 A1 | 4/2003 | Tews et al. | |
| 2004/0087119 A1 * | 5/2004 | Maa et al. | 438/518 |
| 2004/0142541 A1 * | 7/2004 | Cohen et al. | 438/479 |
| 2005/0098829 A1 * | 5/2005 | Doris et al. | 257/351 |

FOREIGN PATENT DOCUMENTS

| | | |
|---|---|---|
| EP | 0 967 636 A2 | 12/1999 |
| EP | 1 174 928 A1 | 1/2002 |
| WO | WO 94/27317 | 5/1993 |
| WO | WO 02/454156 A2 | 6/2002 |

OTHER PUBLICATIONS

Rim, et al. "Characteristics and Device Design of Sub-100 nm Strained Si N- and PMOSFETs", 2002 Symposium On VLSI Technology Digest of Technical Papers, IEEE, pp 98-99.

Scott, et al. "NMOS Drive Current Reduction Caused by Transistor Layout and Trench Isolation Induced Stress", International Electron Devices Meeting, 34.4.1, IEEE, Sep. 1999.

Ootsuka, et al. "A Highly Dense, High-Performance 130nm node CMOS Technology for Large Scale System-on-a-Chip Application", International Electron Device Meeting, 23.5. 1, IEEE, Apr. 2000.

Ito, et al. "Mechanical Stress Effect of Etch-Stop Nitride and its Impact on Deep Submicron Transistor Design", International Electron Devices Meeting, 10.7.1, IEEE, Apr. 2000.

Shimizu, et al. "Local Mechanical-Stress Control (LMC) : A New Technique for CMOS-Performance Enhancement", International Electron Devices Meeting, IEEE, Mar. 2001.

Ota, et al. "Novel Locally Strained Channel Technique for high Performance 55nm CMOS", International Electron Devices Meeting, 2.2.1, IEEE, Feb. 2002.

Ouyang, et al. "Two-Dimensional Bandgap Engineering in a Novel Si/SiGe pMOSFETS With Enhanced Device Performance and Scalability", Microelectronics Research Center, pp 151-154, 2000 IEEE.

Sayama et al., "Effect of <Channel Direction for High Performance SCE Immune pMOSFET with Less Than 0. 15um Gate Length"ULSI Development Center, pp27.5.1-27.5.4, 1999 IEEE.

* cited by examiner

ULTRA-THIN, HIGH QUALITY STRAINED SILICON-ON-INSULATOR FORMED BY ELASTIC STRAIN TRANSFER

RELATED APPLICATIONS

This application is related to co-pending and co-assigned U.S. patent application Ser. No. 10/300,189, filed Nov. 20, 2002, entitled "Relaxed Low-Defect SGOI For Strained Si CMOS Applications". The entire content of the aforementioned U.S. Patent Application is incorporated herein by reference.

FIELD OF THE INVENTION

The present invention relates to a method of fabricating a semiconductor structure that can be used as a substrate for high performance complementary metal oxide semiconductor (CMOS) devices, and more particularly to a method of creating a first strained semiconductor layer over an insulating layer. Even more particularly, the present invention provides a method of forming a strained semiconductor-on-insulator (SSOI) substrate material.

BACKGROUND OF THE INVENTION

In the semiconductor industry, there has recently been a high-level of activity using strained Si-based heterostructures to achieve high carrier mobility structures for complementary metal oxide semiconductor (CMOS) applications. Traditionally, to boost performance of NFET and PFET devices, the prior art to implement this has been to grow strain Si layers on a thick (on the order of about 1 to about 5 micrometers) relaxed SiGe buffer layers.

Despite the high channel electron mobilites reported for prior art heterostructures, the use of thick SiGe buffer layers has several noticeable disadvantages. First, thick SiGe buffer layers are not typically easy to integrate with existing Si-based CMOS technology. Second, the defect densities, including threading dislocations (TDs) and misfit dislocations (MDs) are from about $10^6$ to about $10^8$ defects/cm$^2$ which are still too high for realistic VLSI (very large scale integration) applications. Thirdly, the nature of the prior art structures precludes selective growth of the SiGe buffer layer so that circuits employing devices with strained Si, unstrained Si and SiGe materials are difficult, and in some instances, nearly impossible to integrate.

In view of the drawbacks mentioned above with prior art methods of manufacturing strained-Si based heterostructures in which a relaxed SiGe alloy layer remains in the structure, there is a need for developing a new and improved method that allows one to fabricate a strained Si-based heterostructure, while maintaining the standard CMOS processing procedures for standard (i.e., unstrained) Si technologies. Specifically, a new method is needed that allows for the fabrication of a strained semiconductor-on insulator-substrate (SSOI) in which the strained semiconductor layer is located directly atop an insulating layer.

SUMMARY OF THE INVENTION

The present invention provides a method for fabricating a thin (less than 500 Å) first semiconductor layer that is mechanically strained in a tensile or compressive manner over an insulating layer, which, in turn, exists on a semiconductor substrate. Specifically, the method of the present invention allows for the formation of a strained semiconductor-on-insulator (SSOI) heterostructure, without the presence of SiGe in the final structure.

The method of the present invention takes advantage of the visco-elastic properties of a buried insulating layer of a semiconductor substrate, which includes at least a first semiconductor layer located atop the buried insulating layer, when it is heated to high temperatures. Initially, a stress-providing layer, such as a strained SiGe alloy layer, a strained SiN layer, a strained SiC layer or any other layer that can be formed under either compressive or tensile strain, is formed on a surface of the first semiconductor layer of the substrate. The stress-providing layer can be under tensile or compressive stress at this point of the inventive process. The stress-providing layer and the first semiconductor layer are then patterned into islands using standard lithographic and etching techniques. A high-temperature annealing step is then performed to allow elastic relaxation of the stress-providing layer by expansion of the underlying first semiconductor layer on the now viscous buried insulating layer. At, or about, equilibrium, the in-plane forces arising from the stress (compressive or tensile) in the stress-providing layer are balanced by the stress (compressive or tensile), which has been transferred to the underlying first semiconductor layer as it expands on the buried insulating layer.

The annealing step of the present invention is performed in such a way as to minimize the amount of Ge diffusion into the first semiconductor layer. After the annealing step, the stress-providing layer is selectively removed at a temperature below the reflow temperature of the buried insulating layer. The reflow temperature of the buried insulating layer can be controlled in the present invention to some extent by doping it with different elements. For example, boron can be used as a dopant species to reduce the reflow temperature of the buried insulating layer. After removing the stress-providing layer, what remains is a thin, strained (tensile or compressive) first semiconductor layer (less than 500 Å) atop the buried insulating layer of the substrate.

In broad terms, the method of the present invention, which may also be referred to as Visco-Elastic Strain Transfer (VEST), includes the steps of:

forming a stress-providing layer over a structure comprising a first semiconductor layer, said first semiconductor layer is located atop an insulating layer;

patterning said stress-providing layer and said first semiconductor layer into at least one island;

heating the structure containing said at least one island to a temperature that causes strain transfer from the stress-providing layer to the first semiconductor layer; and removing the stress-providing layer to form a first strained semiconductor island layer directly atop said insulating layer.

In some embodiments of the present invention, the VEST method described above can be modified so as to form a strained semiconductor-on-insulator (SSOI) that has selective strain values (positive and negative) by providing islands that have different stress-providing layers, e.g., SiGe/Si or SiN/Si.

In addition to the VEST method described above, the present invention also provides a strained semiconductor-on-insulator (SSOI) heterostructure in which at least one thin (less than 500 Å) strained first semiconductor island layer is located atop a buried insulating layer, where the strained first semiconductor island layer has a low stacking fault (SF) defect density (less than about 1000 SF defects/cm$^2$) and a low threading defect density (on the order of less than about $10^6$ TDs/cm$^2$).

DETAILED DESCRIPTION OF THE INVENTION

Figure 1A:
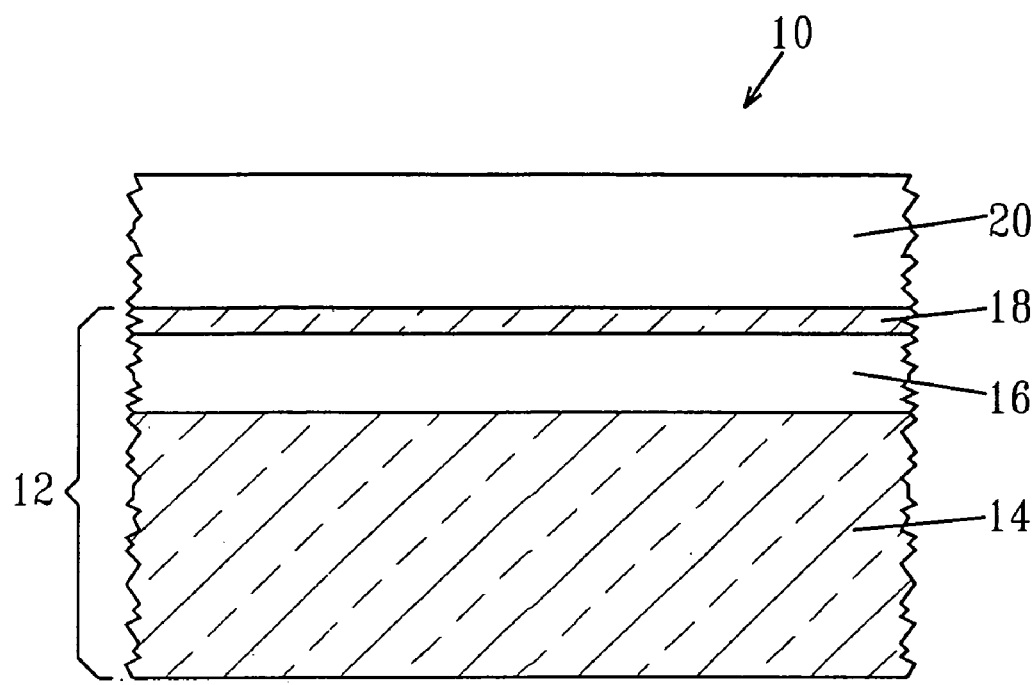
FIGS. 1A–1D are pictorial representations (through cross sectional views) illustrating the basic processing steps that are employed in the present invention in fabricating a first strained semiconductor layer on top of an insulating layer.

The present invention, which provides a method of fabricating a strained semiconductor-on-insulator (SSOI) heterostructure as well as a low-defect density (SFs and TDs) SSOI heterostructure produced by the inventive method, will now be described in greater detail by referring to the drawings that accompany the present application. The accompanying drawings, which are not drawn to scale, are provided for illustrative purposes only and like and/or corresponding elements referred to in the drawings are described with respect to like reference numerals.

The VEST process begins with first providing a layered structure 10 such as shown in FIG. 1A. Layered structure 10 includes a semiconductor substrate 12 having a stress-providing layer 20 located on an upper surface thereof. The semiconductor substrate 12 includes a bottom semiconductor layer 14, a buried insulating layer 16 and a top semiconductor layer 18 (hereinafter referred to as the first semiconductor layer).

In the embodiment depicted in FIG. 1A, the buried insulating layer 16 is present continuously throughout the entire structure. In another embodiment, which is not shown herein, the buried insulating layer 16 is present as discrete and isolated regions or islands that are surrounded by semiconductor material, i.e., layers 14 and 18.

The first semiconductor layer 18 comprises any semiconductor material which can have a strain imparted thereon. Examples of such semiconductor materials for the first semiconductor layer 18 include, but are not limited to: Si, SiC, SiGe, SiGeC, Ge, GaAs, InAs, InP or other III/V or II/V compound semiconductors. Preferably, the first semiconductor layer 18 is a Si-containing semiconductor material such as Si, SiC, SiGe, or SiGeC. Even more preferably, the first semiconductor layer 18 of semiconductor substrate 12 is comprised of Si or SiGe. The first semiconductor layer 18 is a single crystal material that typically has a misfit and TD density of less than about $1 \times 10^5$ defects/cm².

The buried insulating layer 16 of the layered structure 10 shown in FIG. 1A comprises any material that is highly resistant to Ge diffusion. Examples of such insulating and Ge diffusion resistant materials include, but are not limited to: crystalline or non-crystalline oxides or nitrides. In one preferred embodiment, the buried insulating layer 16 is an oxide such as $SiO_2$.

The bottom semiconductor layer 14 of the substrate 12 includes any semiconductor material which can be the same or different than the semiconductor material of the first semiconductor layer 18.

The semiconductor substrate 12 may be a conventional silicon-on-insulator (SOI) substrate material wherein region 16 is a buried oxide (BOX) that electrically isolates a first semiconductor layer 18 from the bottom semiconductor 12. The SOI substrate may be formed utilizing conventional SIMOX (separation by ion implantation of oxygen) processes well-known to those skilled in the art, as well as the various SIMOX processes mentioned in co-assigned U.S. patent application Ser. No. 09/861,593, filed May 21, 2001; Ser. No. 09/861,594, filed May 21, 2001, now U.S. Pat. No. 6,486,037; Ser. No. 09/861,590, filed May 21, 2001, now U.S. Pat. No. 6,602,757; Ser. No. 09/861,596, filed May 21, 200, now U.S. Pat. Nos. 6,541,356; and Ser. No. 09/884,670, filed Jun. 19, 2001 as well as U.S. Pat. No. 5,930,634 to Sadana, et al., the entire contents of each are incorporated herein by reference. Note that the process disclosed in the '590 application can be employed herein to fabricate a patterned substrate.

Alternatively, the semiconductor substrate 12 may be made using other conventional processes including, for example, a layer transfer process in which thermal bonding and cutting are employed. In addition to these methods that form SOI substrates, the semiconductor substrate 12 may be a non-SOI substrate, which is made using conventional deposition processes as well as lithography and etching (employed when fabricating a patterned substrate). Specifically, when non-SOI substrates are employed, the initial structure is formed by depositing an insulating layer atop a surface of a semiconductor substrate, via conventional deposition or thermal growing processes, optionally patterning the insulating layer by employing conventional lithography and etching, and thereafter forming a first semiconductor layer atop the insulating layer using conventional deposition processes including, for example, chemical vapor deposition (CVD), plasma-assisted CVD, sputtering, evaporation, chemical solution deposition or epitaxial growth.

The thickness of the various layers of the semiconductor substrate 12 may vary depending on the process used in making the same. Typically, however, the first semiconductor layer 18 has a thickness that is less than about 500 Å, with a thickness from about 50 to about 450 Å being more typical. In the case of buried insulating layer 16, that layer may have a thickness from about 200 to about 20000 Å, with a thickness from about 500 to about 5000 Å being more typical. The thickness of the bottom semiconductor layer 14 is inconsequential to the present invention. It is noted that the thicknesses provided above are exemplary and by no ways limit the scope of the present invention.

A stress-providing layer 20 is then formed atop the upper surface layer, i.e., atop the first semiconductor layer 18, of the semiconductor substrate 12. The stress-providing layer 20 includes any material that is capable of inducing a stress to the underlying first semiconductor layer 18. The strain may be a compressive stress or a tensile stress depending on the type of material being deposited as well as the type of material present in the first semiconductor layer 18. Examples of stress-providing materials that can be employed as layer 20 include, but are not limited to: Ge-containing materials, such as pure Ge or a SiGe alloy layer that contain up to 99.99 atomic percent Ge, SiN, SiC, and silicate glasses such as boron phosphorous doped silicate (BPSG). In some preferred embodiments, the stress-providing layer 20 is comprised of a Ge-containing material, particularly a SiGe alloy, while in others the stress-providing layer 20 is comprised of SiN.

The stress-providing layer 20 can be formed by an epitaxial growth process including, for example, low-pressure chemical vapor deposition (LPCVD), ultra-high vacuum chemical vapor deposition (UHVCVD), atmospheric pressure chemical vapor deposition (APCVD), molecular beam epitaxy (MBE) and plasma-enhanced chemical vapor deposition (PECVD).

The thickness of the stress-providing layer 20 can vary depending upon the type of material and method used in forming the same. Typically, the stress-providing layer 20 has a thickness that is greater than the underlying first semiconductor layer 18. An illustrative thickness range for the stress-providing layer 20 is from about 200 to about 20000 Å, with a range from about 300 to about 5000 Å being more typical.

After providing the layered structure 10 shown in FIG. 1A, the structure shown in FIG. 1A may then be subjected to an optional ion implantation step wherein dopants that are capable of controlling the reflow temperature of the buried insulating layer 16 are implanted. The implant may be performed with, or without, the use of an implantation mask.

The types of dopant species that can be implanted at this point of the present invention include B, Al, P, Sb, As, Cs, Na, and/or F. The dopant species are implanted using conditions such that the peak dopant concentration is located substantially within the buried insulating layer 16.

The implant step of the present invention is conducted at approximately room temperature, i.e., a temperature from about 283 K to about 303 K, using a beam current density from about 0.01 to about 1 microamps/Cm$^2$. The concentration of the dopant species may vary depending upon the type of species employed. Typically, however, the concentration of dopant species being implanted at this point of the present invention is below $10^{17}$ cm$^{-2}$, with an ion concentration from about $10^{14}$ to about $10^{16}$ cm$^{-2}$ being more highly preferred. The energy of this implant may also vary depending upon the type of dopant species that is being implanted, with the proviso that the implant energy must be capable of positioning ions substantially within the buried insulating layer 16. For example, when boron is employed as the implant species, the energy used to ensure that the boron is substantially implanted into the buried insulating layer 16 is from about 10 to about 200 keV, with an energy from about 20 to about 150 keV being more highly preferred.

In another embodiment, energetic ions are optionally implanted into the layered structure 10 shown in FIG. 1A so that the energetic ions are implanted into, or near, the interface formed between the first semiconductor layer 18 and the buried insulating layer 16. The implant of energetic ions may be performed alone or in conjunction with the dopant species implant. It may occur before or after the implant of the dopant species. This implant of energetic ions serves to minimize diffusion of Ge from the stress-providing layer 20 when the same is comprised of a Ge-containing layer by lowering the thermal budget necessary to transfer strain from layer 20 to layer 18. Hydrogen, deuterium, helium, oxygen, neon, and mixtures thereof can be used to lower the thermal budget necessary to transfer strain from layer 20 to layer 18. It is believed that damage at the buried insulating layer 16/first semiconductor layer 18 interface facilitates lateral expansion of the island thereby lowering the temperature and/or time required for strain transfer. Isotopes of the aforementioned energetic ions are also contemplated herein. Preferred ions used in the present invention for this implant are hydrogen ions (H$^+$). It is noted that other species of hydrogen such as H$_2^+$ can also contemplated herein.

This optional implant step of the present invention at, or near the interface formed between the first semiconductor layer 18 and the buried insulating layer 16 is conducted at approximately room temperature, i.e., a temperature from about 283 K to about 303 K, using a beam current density from about 0.01 to about 1 microamp/cm$^2$. The concentration of the energetic ions being implanted may vary depending upon the type of implant species employed. Typically, however, the concentration of the energetic ions used at this point of the present invention is below 3E16 cm$^{-2}$, with an ion concentration from about 1E16 to about 2.99E16 cm$^{-2}$ being more highly preferred. The energy of this implant may also vary depending upon the type of ion that is being implanted, with the proviso that the implant energy must be capable of positioning ions at, or near, the first semiconductor/buried insulating layer interface. For example, when hydrogen is employed as the implant ion, the energy used is from about 1 to about 100 keV, with an energy from about 3 to about 20 keV being more highly preferred.

It is noted one of the implant steps mentioned above may be used, both implant steps (in any order) may be used or none of the implant steps may be used.

Next, the layered structure 10, particularly the stress-providing layer 20 and the first semiconductor layer 18, are patterned so as to form at least one island 22 comprising a stress-providing/first semiconductor bilayer on the surface of the buried insulating layer 16. The resultant structure including the at least one island 22 is shown, for example, in FIG. 1B.

The patterning is achieved using conventional lithography and etching. The lithography step includes forming a photoresist (not shown) on the surface of the stress-providing layer 20, subjecting the photoresist to a pattern of radiation and developing the photoresist using a conventional resist developer. The etching step includes any conventional etching process including, for example, a dry etching process such as reactive-ion etching, ion beam etching, plasma etching or laser ablation; a wet etch process in which a chemical etchant is employed; or any combination thereof. A single etch may be used or multiple etching steps can be used. The patterned resist can be removed prior to pattern transfer into the at least the stress-providing layer 20, or the patterned resist is removed after etching has been completed. Removal of the patterned resist is achieved by a conventional resist stripping process.

It is noted that although the drawings depict the formation of a single island structure 22, the present invention also contemplates the formation of a multitude of such island structures 22 on the surface of buried insulating layer 16. Each island 22 is generally small in size, having a lateral width of about 500 μm or less. More preferably, the island 22 has a lateral width from about 0.01 to about 100 μm. It should be noted that the width of the island 22 formed by the present invention must be sufficient to permit relaxation of the stress-providing film 20 by ensuring that the forces of relaxation in the island 22 outweigh the forces that oppose relaxation.

Next, a high temperature annealing process is performed which will allow strain transfer from the stress-providing layer 20 to the first semiconductor layer 18. The resultant structure formed after the high temperature annealing step has been performed is shown in FIG. 1C. In this drawing, reference numeral 24 is used to denote the strained first semiconductor layer. Note that some relaxation of the stress-providing layer 20 may occur during the high temperature annealing step of the present invention.

The heating step of the present invention is an annealing step that is performed at a temperature that causes the first semiconductor layer 18 to expand or contract laterally over the buried insulator layer 16. That is, the heating step of the present invention is performed to allow elastic relaxation of the strained-providing layer 20 by expansion of the underlying first semiconductor layer 18 on the buried insulating layer 16, which becomes viscous during this heating step.

The temperature of the heating step of the present invention is chosen to be above the reflow temperature of the buried insulating layer 16 at the first semiconductor/buried insulating layer interface. Specifically, the heating temperature employed in the present invention which achieves the above features is typically about 900° C. or greater, with a temperature from about 950° to about 1335° C. being more typical. Within the above temperature range, an equilibrium exists between the patterned stress-providing layer 20 and the first semiconductor layer 18 wherein the in-plane forces arising from the stress-providing layer 20 and the underlying first semiconductor layer 18 are allowed to cancel by expansion or contraction on the buried insulating layer 16. Moreover, the heating step of the present invention is performed within temperatures in which the amount of Ge diffusion is minimized in the case when the stress-providing layer 20 is a Ge-containing layer.

The heating step is typically carried out in an inert ambient such as He, Ar, $N_2$, Xe, Kr, Ne or a mixture thereof. The inert gas ambient may also be diluted with an oxygen-containing gas.

The heating step may be carried out for a variable period of time that typically ranges from about 1 sec to about 1800 minutes, with a time period from about 5 sec to about 600 minutes being more highly preferred. The heating step may be carried out at a single targeted temperature, or various ramp and soak cycles using various ramp rates and soak times can be employed.

After performing the heating step that causes strain transfer, the stress-providing layer 20 is then selectively removed so as to expose the now strained first semiconductor island layer 24. The stress-providing layer 20 is removed at this point of the present invention utilizing a number of etching techniques that are capable of selectively removing the stress-providing layer 20. For example, a timed etching process or a selective etching process can be used to remove the stress-providing layer 20 from the structure. The resultant structure formed after removal of the stress-providing layer 20 is shown in FIG. 1D.

After removing the stress-providing layer 20, an optional thermal treatment step may be performed to further improve the characteristics of the material. The thermal treatment may be a furnace step to anneal out residual damage caused by the optional implantations steps. Alternatively, a high temperature anneal in a H-containing ambient may be performed to remove excess boron from the strained first semiconductor layer 24.

In accordance with the present invention, the strained first semiconductor island layer 24 is located atop the insulating layer 16 and it has a thickness that is relatively thin (less than 500 Å). The strain may be compressive or tensile depending on the previous type of strain in the stress-providing layer 20. The strained first semiconductor island layer 24 has a defect density including misfits and TDs, of about $5 \times 10^6$ defects/$cm^2$ or less. The stacking fault (SF) density of the strained first semiconductor island layer 24 is about 1000 defects/$cm^2$ or less.

The stacking fault density is measured using the etching technique described in U.S. Ser. No. 10/654,231, filed Sep. 3, 2003, the entire content of which is incorporated herein by reference.

The embodiment depicted in FIGS. 1A–1D describes the case wherein the strained first semiconductor island layers formed on the surface of the buried insulating layer each have the same type of strain (either positive or negative). In another embodiment of the present invention, as depicted in FIG. 2, a structure containing strained layers of different strain values (positive and/or negative) are formed atop the buried insulating layer. In particular, FIG. 2 shows a strained semiconductor structure that includes first strained semiconductor layer 24 of a first stain value on a surface of a buried insulating layer 16, and a second strained semiconductor layer 50 of a second strain value, that differs from the first, located atop the same buried insulating layer 16. The second strained semiconductor layer 50 is comprised of one of the semiconductor materials illustrated above for the first semiconductor layer 18.

In the embodiment shown in FIG. 2, two different stress-providing layers and lithography are used in forming the structure. Specifically, a first block mask (not shown) is formed over a predetermined portion of the semiconductor substrate 12 by lithography. With the first block mask in place, a first stress-providing layer 20 is formed atop the exposed portion of the first semiconductor layer 18. After forming the first stress-providing layer, the first block mask is removed and a second block mask is formed atop the portion of the layered structure including the first stress-providing layer 20. After second block mask formation which is performed via lithography, a second stress-providing layer that has a different stress value is formed atop the exposed portions of the first semiconductor layer 18 and the second block mask is removed. A conventional resist stripping process can be used in removing each of the block masks from the structure. The process flow is then the same as described above in FIGS. 1B–1D.

Figure 1B:
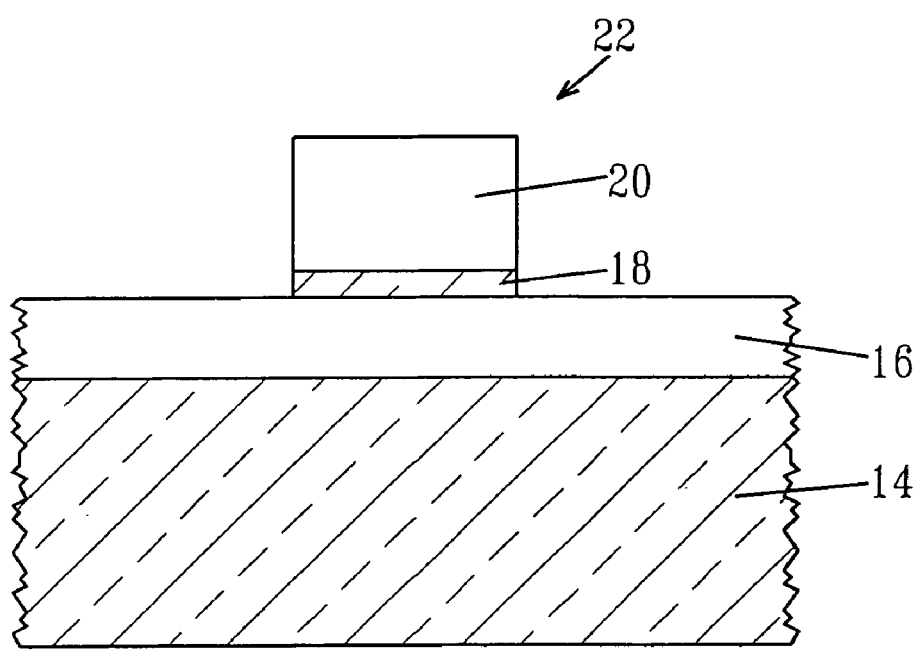
Figure 1C:
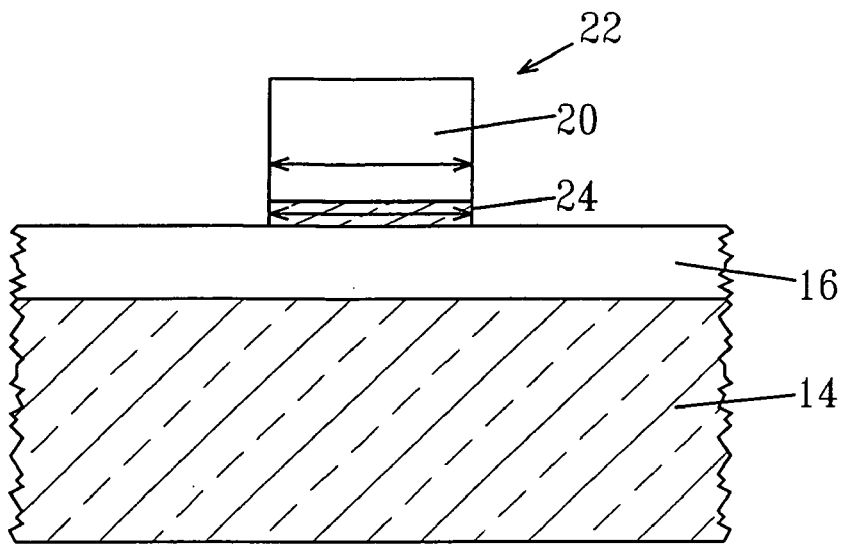
Figure 1D:
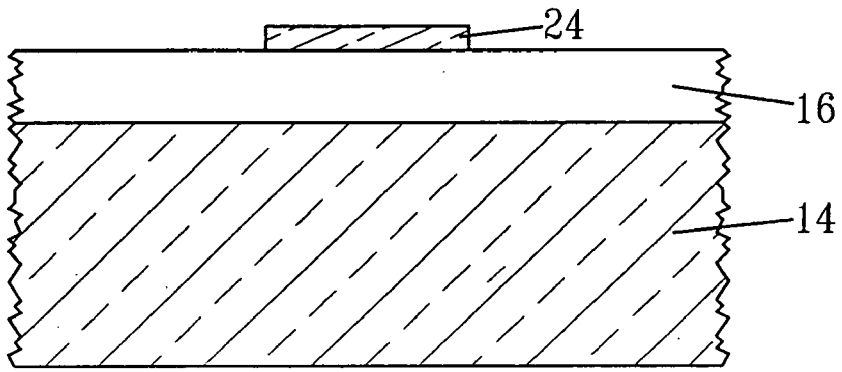
Figure 2:
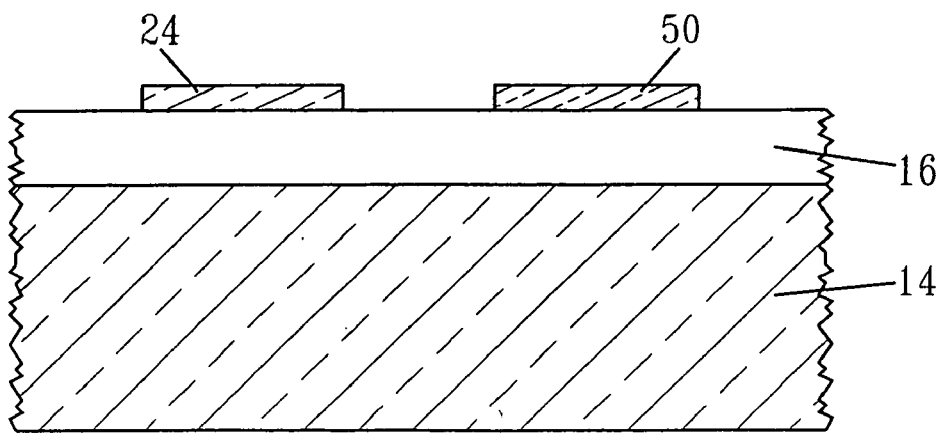
FIG. 2 is a pictorial representation (through a cross sectional view) illustrating a strained semiconductor-on-insulator (SSOI) with selective strain values (positive or negative) that is formed using an alternative embodiment of the present invention.

Alternatively, the structure shown in FIG. 2 can be formed by first performing the process steps depicted in FIGS. 1A–1D, then forming a block mask over the thus formed strained first semiconductor island layer 24. A semiconductor material including materials described above for the first semiconductor layer 18 can then be deposited atop exposed portions of the buried insulating layer 16. After deposition of the semiconductor material (which can be the same or different from layer 18), a second stress-providing layer having a different strain value than the first stress-providing layer is formed atop the semiconductor material and the processing steps described in FIGS. 1B–1D are then performed.

As an example, a 600 Å thick, 17 atomic percent SiGe layer was deposited on a 350 A thick SOI layer. Implantation of H was performed at 6.7 keV to a dose of $2.5 \times 10^{16} H/cm^2$ placing the ion peak near the buried oxide/SOI layer. The SiGe/SOI layers were then patterned into roughly $10 \times 10\ \mu m$ islands and subjected to a 1100° C. rapid thermal anneal (few seconds). The SiGe was measured to be 40% relaxed thereby transferring 0.24% tensile strain into the underlying thin SOI layer. The extent of Ge diffusion into the SOI layer is below 15 Å for this thermal budget.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What we claim as new is:

1. A method of forming a first strained semiconductor layer over an insulating layer comprising the steps of:

forming a stress-providing layer over a structure comprising a first semiconductor layer, said first semiconductor layer is located atop an insulating layer;

patterning said stress-providing layer and said first semiconductor layer into at least one island;

heating the structure containing said at least one island to a temperature that causes strain transfer from the stress-providing layer to the first semiconductor layer; and removing the stress-providing layer to form a first strained semiconductor island layer directly atop said insulating layer.

2. The method of claim 1 wherein said first semiconductor layer and said insulating layer are components of a preformed silicon-on-insulator substrate.

3. The method of claim 2 wherein said preformed silicon-on-insulator substrate is fabricated by separation by ion implantation of oxygen or a layer transfer process.

4. The method of claim 1 wherein at least one implantation step is performed between said forming and patterning step.

5. The method of claim 4 wherein said at least one implantation step comprises implanting a dopant species into at least said insulating layer.

6. The method of claim 5 wherein said dopant species is boron.

7. The method of claim 4 wherein said at least one implantation step comprises implanting an energetic ion at, or near, an interface formed between the first semiconductor layer and the insulating layer.

8. The method of claim 7 wherein said energetic ion comprises hydrogen, deuterium, helium, oxygen, neon or mixtures and isotopes thereof.

9. The method of claim 7 wherein said energetic ion is a hydrogen ion.

10. The method of claim 1 wherein said patterning comprises lithography and etching.

11. The method of claim 1 wherein said first semiconductor layer comprises Si, SiC, SiGe, SiGeC, Ge, GaAs, InAs or InP.

12. The method of claim 1 wherein said stress-providing layer comprises a Ge-containing layer, a silicon nitride layer, a silicon carbide layer, a silicate glass or mixtures thereof.

13. The method of claim 1 wherein said heating step is performed at a temperature that causes the insulating layer to have a visco-elastic property.

14. The method of claim 13 wherein said heating is performed at a temperature that is about 900° C. or greater.

15. The method of claim 1 wherein said first strained semiconductor layer has a tensile strain.

16. The method of claim 1 wherein said first strained semiconductor layer has a compressive strain.

17. The method of claim 1 further comprising forming a second island having a second stress-providing layer that has a different stress then the stress in said stress-providing layer.

18. The method of claim 1 wherein said first semiconductor layer comprises III/V or II/VI compound semiconductor, where II, III, V and VI represents groups from the Periodic Table of Elements.

* * * * *

UNITED STATES PATENT AND TRADEMARK OFFICE
CERTIFICATE OF CORRECTION

PATENT NO.      : 6,991,998 B2                                               Page 1 of 1
APPLICATION NO. : 10/883883
DATED           : January 31, 2006
INVENTOR(S)     : Stephen W. Bedell et al.

It is certified that error appears in the above-identified patent and that said Letters Patent is hereby corrected as shown below:

Column 5, Line 23:
"microamps/Cm$^2$" should read -- microamps/cm$^2$ --

Column 8, Line 43:
"350A" should read -- 350Å --

Column 10, Line 25, Claim 18:
"comprises III/V" should read -- comprises a III/V --

Signed and Sealed this

Tenth Day of October, 2006

JON W. DUDAS
*Director of the United States Patent and Trademark Office*